United States Patent [19]

Morita

[11] Patent Number: 4,920,075
[45] Date of Patent: Apr. 24, 1990

[54] METHOD FOR MANUFACTURING A SEMICONDUCTOR DEVICE HAVING A LENS SECTION

[75] Inventor: Shigeru Morita, Tokyo, Japan

[73] Assignee: Tokyo Shibaura Denki Kabushiki Kaisha, Kawasaki, Japan

[21] Appl. No.: 4,759

[22] Filed: Jan. 7, 1987

Related U.S. Application Data

[63] Continuation of Ser. No. 504,123, Jun. 14, 1983, abandoned.

[30] Foreign Application Priority Data

Jun. 15, 1982 [JP] Japan .................. 57-102831

[51] Int. Cl.⁵ ............................. H01L 21/08
[52] U.S. Cl. .................. 437/228; 437/247; 437/240
[58] Field of Search .............. 437/5, 23, 238, 239, 437/240, 247, 248, 249, 904, 905, 228; 156/652, 656, 657; 148/DIG. 133

[56] References Cited

U.S. PATENT DOCUMENTS

| | | |
|---|---|---|
| 3,925,572 | 12/1975 | Naber .................. 148/DIG. 133 |
| 3,981,023 | 9/1976 | King et al. .................. 148/DIG. 72 |
| 4,110,122 | 6/1978 | Kaplow et al. .................. 357/30 |
| 4,225,380 | 9/1980 | Wickens .................. 156/662 |
| 4,273,805 | 6/1981 | Dawson et al. .................. 437/203 |
| 4,279,690 | 7/1981 | Dierschke .................. 156/649 |
| 4,292,512 | 9/1981 | Miller et al. .................. 357/19 |
| 4,474,831 | 10/1984 | Downey .................. 437/229 |
| 4,535,528 | 8/1985 | Chen .................. 148/DIG. 133 |
| 4,581,622 | 4/1986 | Takasaki et al. .................. 357/30 |

FOREIGN PATENT DOCUMENTS

| | | | |
|---|---|---|---|
| 0080988 | 7/1978 | Japan .................. | 29/569 L |
| 0090568 | 7/1981 | Japan .................. | 357/30 |
| 0181648 | 10/1984 | Japan .................. | 437/922 |
| 0052041 | 3/1985 | Japan .................. | 148/DIG. 99 |

Primary Examiner—Brian E. Hearn
Assistant Examiner—Kevin McAndrews
Attorney, Agent, or Firm—Finnegan, Henderson, Farabow, Garrett and Dunner

[57] ABSTRACT

A method for manufacturing a semiconductor device with a lens section. A semiconductor element is formed in a semiconductor substrate and a transparent layer is formed on this semiconductor element. The transparent layer is patterned to form the lens section.

8 Claims, 4 Drawing Sheets

METHOD FOR MANUFACTURING A SEMICONDUCTOR DEVICE HAVING A LENS SECTION

This application is a continuation, of application Ser. No. 504,123, filed June 14, 1983, now abandoned.

BACKGROUND OF THE INVENTION

This invention relates to a method for manufacturing semiconductor device with an energy beam-converging section.

To supplement the decline in yield of a semiconductor memory due to high density and large-scale integration, it is widely accepted to use a redundancy technique of providing not only a main circuit but also redundant elements in order to prevent the main circuit from being disabled by the presence of a defective portion. According to this redundancy technique, a switching section for substituting the defective section of the main circuit for one of the redundant elements is provided. Later, laser beams, for example, are used to actuate said switching section. The technique of radiating the laser beams is set forth, for example, in "Reliability of LSI Memory Circuits Exposed to Laser Cutting" by Myron J. Rand, IEEE International Reliability Physics Symposium, 17th Annual Proceedings, 1979. However, this proposed laser beam-emitting technique has the drawbacks that when a large number of switching sections have to be actuated, it is necessary to align the focus of the laser device with the switching sections with high precision. This operation is generally accompanied with difficulties. For the accurate alignment of the focus of the laser device lens with the respective switching sections, it is necessary to provide a high precision locating mechanism, thereby increasing the cost of the energy beam-converging device.

SUMMARY OF THE INVENTION

This invention is intended to provide a method for producing semiconductor device in which energy beams can be easily converged on a prescribed target without applying a laser device equipped with a locating mechanism of particularly high precision.

These and other objects have been attained by producing a semiconductor device which comprises:
- a circuit element provided in the semiconductor device for receiving the energy beams impinged on the circuit element to change the electric property;
- a protective layer formed on the circuit element for protecting the circuit element and for permitting the energy beams to penetrate therethrough to the circuit element; and
- a converging member which is formed on the protective layer and whose optical axis intersects a portion of the circuit element on which energy beams are to be radiated, for converging the energy beams.

The above-mentioned arrangement makes it possible to convert low energy laser beams into high energy laser beams by means of the converging member and to radiate the high energy laser beams on the prescribed one of the circuit elements. If laser beams emitted from a laser device are chosen to have such an energy density as exerts a low thermal effect on the peripheral elements, then the enlargement of the diameter of a flux of laser beams will not cause any difficulties. Therefore, a high tolerance is allowed for the converging of laser beams on a prescribed object, thereby eliminating the necessity of applying a laser device equipped with a locating mechanism of particularly high precision.

BRIEF DESCRIPTION OF THE DRAWINGS

Other objects and advantages of this invention will be apparent from the following description taken in conjunction with the accompanying drawings in which.

DETAILED DESCRIPTION OF THE PREFERRED EMBODIMENTS

Figure 1:
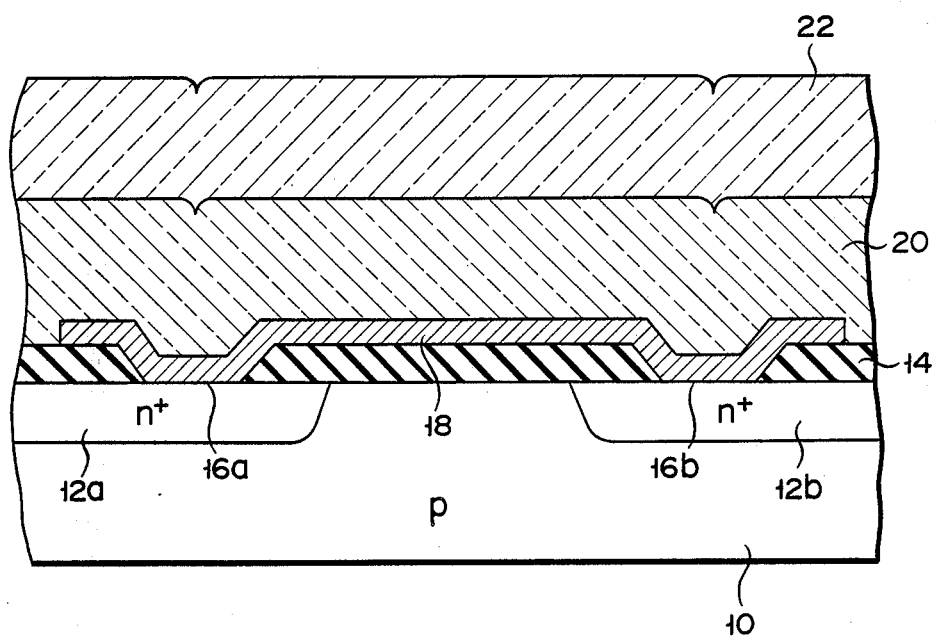
FIGS. 1 and 2 are sectional views showing the steps of manufacturing a semiconductor device embodying this invention.
Figure 2:
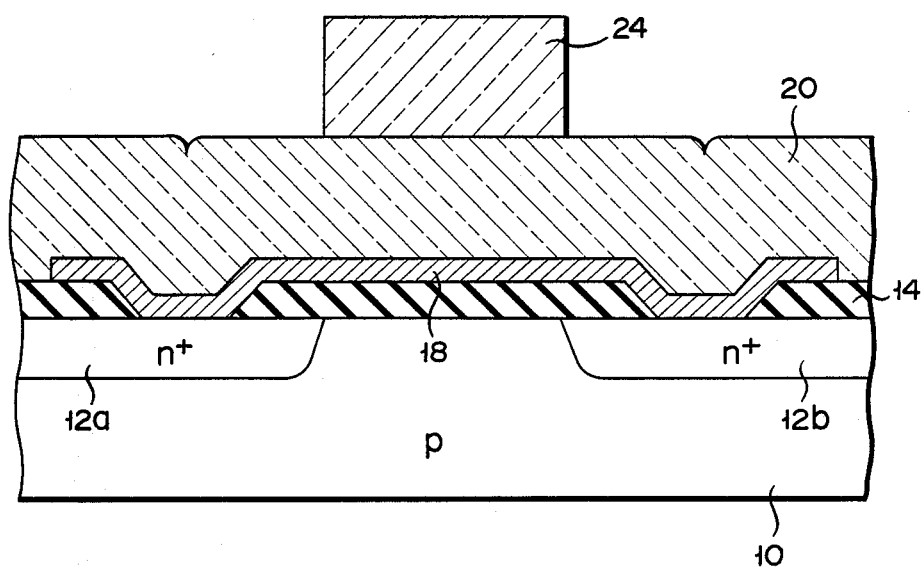

Description will now be given with reference to FIGS. 1 and 2 of a semiconductor device according to a first embodiment of this invention. $n^+$ type diffusion layers 12a and 12b are deposited on the surface of a p type semiconductor substrate 10, and an insulation layer 14 is further formed partly on the substrate 10 and partly on said diffusion layers 12a and 12b. Holes 16a and 16b extending to the $n^+$ type diffusion layers 12a and 12b are drilled in the insulation layer 14. An $n^+$ type polycrystalline silicon layer is formed on the insulation layer 14 to effect connection between the diffusion layers 12a and 12b. The $n^+$ type polycrystalline silicon layer is patterned to provide an $n^+$ type polycrystalline silicon fuse 18. A transparent silicon oxide layer 20 having a thickness of about 2 microns is formed by vapor phase growth on the polycrystalline silicon fuse 18 and insulation layer 14. A transparent phosphorus-containing silicon oxide layer 22 having a thickness of about 2 microns is laid on the silicon oxide layer 20. Later, as shown in FIG. 2, the phosphorus-containing oxide layer 22 is subjected to photoetching to provide, for example, a round columnar block 24 having a diameter of about 4 microns. In this case, a resist mask is formed in the prescribed position and the above-mentioned silicon oxide layer 22 is etched by a solution containing a fluoric acid-series material such as NH4F through the resist mask. Or the silicon oxide layer 22 may be subjected to reactive ion etching through said resist mask. If, in this case, a proper etching time is predetermined by experiments with a test material, the above-mentioned etching can be easily carried out.

Figure 3:
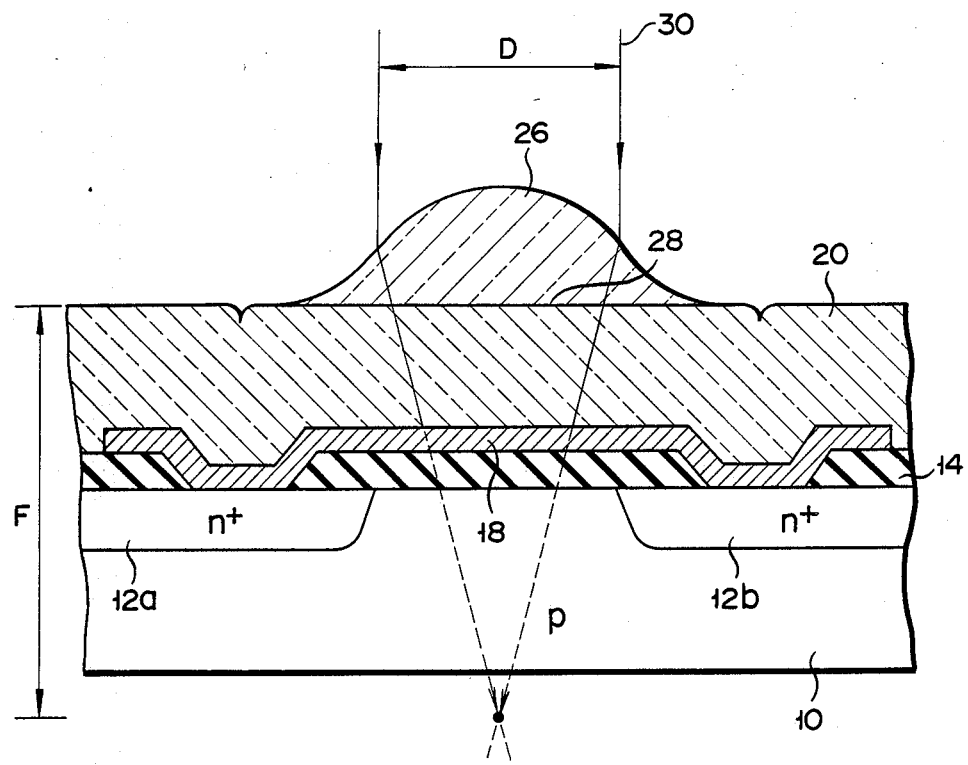
FIG. 3 is a sectional view of a finished semiconductor device embodying this invention.

Later when high temperature treatment is performed in a nitrogen atmosphere at a temperature of 1,000° C. for 20 minutes, the columner block 24 is fused into a semispherical lens (convex lens) 26 as illustrated in FIG. 3, which has a curvature of about 3.1 microns and an absolute refractive index of 1.5. The focal point F of the convex lens 26 is positioned on a point of the optical axis of the convex lens 26 which is about 6 to 9 microns below an interface 28 between the silicon oxide layer 20 and phosphorus-containing silicon oxide layer 22. Now let it be assumed that the convex lens 26 has a curvature of 3.1 microns, and the silicon oxide layer 20 has an absolute refractive index of about 1.46, a value which is substantially equal to that of the lens 26, and also that the occurrence of light refraction can be overlooked between the silicon oxide layer 20 and phosphorus-containing silicon oxide layer 22. Then, the focal point F of the convex lens 26 is assumed to lie at a point 6.8 microns below the aforementioned interface 28 between the silicon oxide layer 20 and the phosphorus-containing silicon oxide layer 22. Further, let it be assumed that the convex lens 26 has a diameter of about 4 microns, and laser beams 30 emitted from an Nd-activated YAG laser device with a wavelength of 1.06 microns are uniformly radiated over the convex lens 26. Then a flus of laser beams converged on the polycrystalline silicon fuse 18 has a diameter of about 2.4 microns. Therefore, laser beams 30 radiated on the unit area of the polycrystalline silicon fuse 18 have an intensity about $(4/2.4)^2 \cong 2.8$ times greater than the laser beams radiated over the convex lens 26. Therefore, the cutting of the respective polycrystalline silicon fuse 18 into two parts can be effected by laser beams having an energy density of about 0.007 to 0.008 $\mu J/\mu^2$, a value about one third of what was required in the past. While this level of energy is sufficient to melt the fust when the energy beams are condensed by the convex lens 26, exposure to this level of energy itself will not disable or deteriorate other semiconductor elements. Consequently, a flux of laser beams can have a diameter of about 20 microns, a value about three times larger than was possible in the past. Since a flux of laser beams having a diameter of 20 microns has only to be radiated so as to cover a lens having a diameter of four microns, a larger focusing tolerance than was possible in the past is allowed. In the focusing of laser beams, an energy beam-converging device embodying this invention allows for an allowance of at least about ±8 microns, a value about 8 times larger than in the past.

Figure 4:
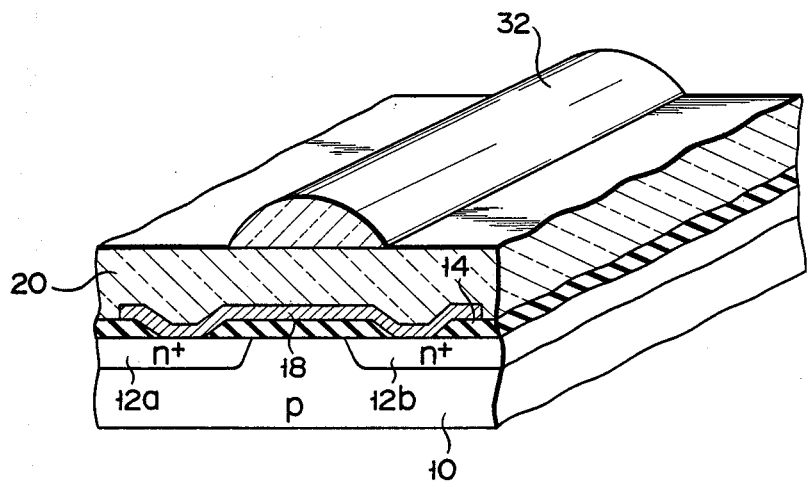
FIG. 4 is an oblique view of another semiconductor device embodying this invention.

Description will now be given with reference to FIG. 4 of a semiconductor device according to a second embodiment of this invention. In this embodiment, a cylindrical convex lens 32 is formed. This arrangement enables a plurality of fuses justaposed lengthwise of the underside of the lens 32 to be respectively cut in two parts by a single radiation of laser beams. The second embodiment of FIG. 4 is substantially the same as that of FIG. 3 in the other respects. The parts of FIG. 4 the same as those of FIG. 3 are denoted by the same numerals, and description thereof is omitted.

Figure 5:
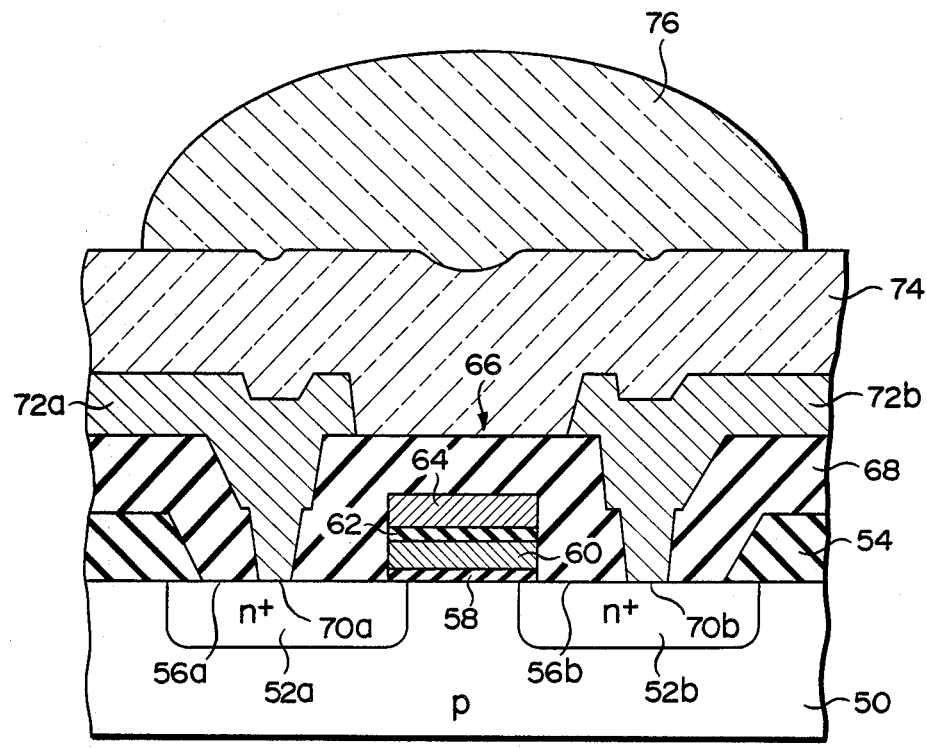
FIGS. 5 to 7 are sectional views of other semiconductor devices embodying the invention.

Description will now be given with reference to FIG. 5 of a semiconductor device according to a third embodiment of this invention. A semiconductor device according to this third embodiment is provided with a programmable read only memory (abbreviated "PROM"). An N+ type source region 52a and N+ type drain region 52b are formed on the surface of a P type semiconductor 50. Mounted on the semiconductor substrate 50 is a first insulation layer 54 which is provided with first holes 56a and 56b to isolate adjacent elements from each other. Provided on a channel region defined between the source region 52a and drain region 52b is a gate section 66 which consists of a first gate oxide layer 58 prepared from a SiO2 film, a floating gate 60 formed of a phosphorus-containing polycrystalline silicon layer, a second gate oxide layer 62 prepared from a SiO2 film, and a control gate 64 formed of a phosphorus-containing polycrystalline layer. A second insulation layer 68 is deposited to cover said gate section 66 and insulation layer 54. A second insulation layer 68 is provided with second holes 70a and 70b communicating with the source region 52a and drain region 52b. Aluminum wires 72a and 72b are laid and connected to the source region 52a and drain region 52b through the corresponding second holes 70a and 70b. A transparent SiO2 layer 74 is deposited to cover the aluminium wires 72a and 72b and second insulation layer 68. A transparent convex lens 76 is set on that portion of the SiO2 layer 74 which faces the gate section 66.

With the semiconductor device of the third embodiment arranged as described above, a negative charge is introduced into the floating gate 60 by setting the control gate 64 at a high potential and the substrate 50 at a low potential. When supplied with a negative charge, the PROM its threshold voltage changed, enabling data to be stored in the memory.

Ultraviolet rays are externally radiated on the floating gate 60 to release the introduced negative charge, that is, erase stored data. With the conventional semiconductor device lacking a lens, it took about 10 to 20 minutes to erase stored data. In contrast, a semiconductor device embodying this invention equipped with the lens 76 enables stored data to be erased in such a short time as accounts for about a half or a third of what was consumed in the past.

Figure 6:
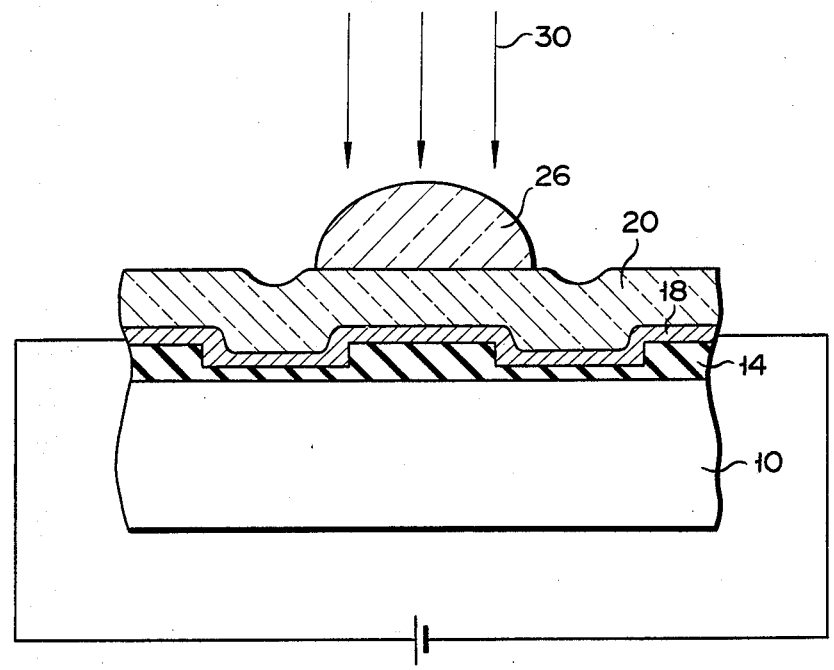
Figure 7:
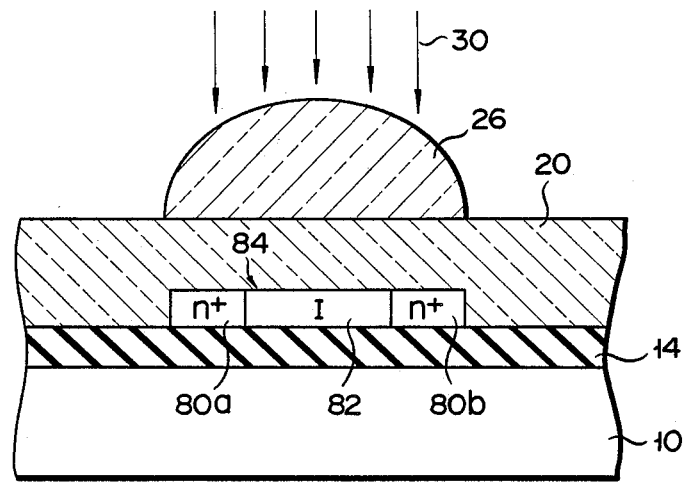

It will be noted that this invention is not limited to the foregoing embodiments. For instance as shown in FIG. 6, it is possible to conduct current through the polycrystalline silicon fuse 18 in advance and radiate laser beams 30 on the fuse 18 while it is preheated. Or as indicated in FIG. 7, it is possible to set a lens 26 on connection means 84 consisting of n+ type diffusion regions 80a, 80b and intrinsic semiconductor region 82 with a silicon oxide layer 20 interposed between said lens 26 and connection means 84, and radiate laser beams 30 on the superposed mass, thereby providing n+ type diffusion regions 80a and 80b.

Throughout the foregoing embodiments, the lenses 26 and 32 were prepared from a phosphorus-containing SiO2 film. However, this invention does not require the exclusive use of such a lens. Namely, the lens may be prepared from a SiO2 film containing another impurity, for example, boron, simple SiO2 film, resist film or film or organic material. Further, the lens need not be fabricated in the semispherical form, but may be shaped like an elliptic form.

What is claimed is:

1. A method for manufacturing an integrated semiconductor device with a lens section comprising the steps of:
   forming a semiconductor element in a semiconductor substrate;
   forming a transparent layer over said semiconductor element;
   etching said transparent layer to form a block structure over said semiconductor element; and
   thermally treating said block structure to form said lens section therefrom to a predetermined curvature.

2. The method according to claim 1, wherein said transparent layer is a silicon oxide layer containing phosphorus.

3. The method according to claim 1, wherein said etching step is achieved by isotropic etching.

4. The method according to claim 3, wherein said isotropic etching is achieved by a solution.

5. The method according to claim 4, wherein said solution contains a fluoric acid-series material.

6. The method according to claim 1, wherein said lens section is commonly formed on a plurality of said semiconductor elements.

7. The method according to claim 6, wherein said lens section is cylindrical.

8. The method according to claim 1, further including the steps of thermally treating said lens section to smooth the surface of said lens section.

* * * * *